(12) United States Patent
Lee et al.

(10) Patent No.: US 10,566,575 B2
(45) Date of Patent: Feb. 18, 2020

(54) ORGANIC LIGHT EMITTING DIODE LIGHTING APPARATUS HAVING AUXILIARY ELECTRODE IN NON-EMISSION AREA

(71) Applicant: LG DISPLAY CO., LTD., Seoul (KR)

(72) Inventors: Kang-Ju Lee, Paju-si (KR); Min-Geun Choi, Paju-si (KR); Jin-Tae Kim, Paju-si (KR); Yong-Hoon Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/141,468

(22) Filed: Sep. 25, 2018

(65) Prior Publication Data
US 2019/0103587 A1  Apr. 4, 2019

(30) Foreign Application Priority Data
Sep. 29, 2017 (KR) .................. 10-2017-0127125

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 51/52* | (2006.01) | |
| *H01L 27/32* | (2006.01) | |

(52) U.S. Cl.
CPC .......... *H01L 51/5268* (2013.01); *H01L 27/32* (2013.01); *H01L 51/5209* (2013.01); *H01L 51/5212* (2013.01); *H01L 51/5218* (2013.01); *H01L 51/5271* (2013.01); *H01L 2251/558* (2013.01)

(58) Field of Classification Search
CPC ............. H01L 51/5268; H01L 51/5218; H01L 51/5212; H01L 27/32; H01L 51/5271; H01L 2251/558; H01L 51/5209
See application file for complete search history.

(56) References Cited

U.S. PATENT DOCUMENTS

| | | | | |
|---|---|---|---|---|
| 2004/0222740 A1* | 11/2004 | Kim | .................... | H01L 27/3244 313/506 |
| 2005/0077816 A1* | 4/2005 | Yamada | .............. | H01L 51/5228 313/503 |
| 2007/0290607 A1* | 12/2007 | Okada | .................. | G02B 5/1871 313/504 |

(Continued)

*Primary Examiner* — Ismail A Muse
(74) *Attorney, Agent, or Firm* — Birch, Stewart, Kolasch & Birch, LLP

(57) ABSTRACT

An organic light emitting diode (OLED) lighting apparatus includes a substrate including a plurality of emission areas and a plurality of non-emission areas surrounding edges of the plurality of emission areas, an overcoat layer disposed on the substrate and having a first non-flat top surface in at least one of the emission areas and a second non-flat top surface in at least one of the non-emission area, an auxiliary electrode disposed on the second non-flat top surface and including a reflective material, a first electrode disposed on the first non-flat top surface in at least one of the emission areas and disposed on the auxiliary electrode in the non-emission areas, an organic emitting layer on the first electrode, and a second electrode on the organic emitting layer, wherein the auxiliary electrode and the first electrode are in electrical contact with each other.

18 Claims, 3 Drawing Sheets

(56) References Cited

U.S. PATENT DOCUMENTS

| | | | | |
|---|---|---|---|---|
| 2013/0285034 A1* | 10/2013 | Akamatsu | ............... | H05B 33/22 |
| | | | | 257/40 |
| 2017/0125738 A1* | 5/2017 | Kim | ................... | H01L 51/5275 |
| 2018/0006258 A1* | 1/2018 | Kim | ................... | G02B 17/026 |
| 2018/0166522 A1* | 6/2018 | Kim | ................... | H01L 27/3248 |

* cited by examiner

ORGANIC LIGHT EMITTING DIODE LIGHTING APPARATUS HAVING AUXILIARY ELECTRODE IN NON-EMISSION AREA

CROSS-REFERENCE TO RELATED APPLICATIONS

This application claims priority to and the benefit of Korean Patent Application No. 10-2017-0127125 filed on Sep. 29, 2017 in the Korean Intellectual Property Office, which is incorporated herein by reference in its entirety into the present application.

BACKGROUND

1. Technical Field

The present disclosure relates to an organic light emitting diode (OLED) lighting apparatus having improved light extraction efficiency.

2. Discussion of the Related Art

Organic light emitting diodes are an self-emission type device in which a light emitting layer is formed between two electrodes disposed on a substrate and an electric signal or the like is supplied between the two electrodes, thereby displaying a desired image.

Such an OLED has characteristics such as a wide viewing angle, an excellent contrast ratio, and rapid response speed. In addition, the OLED has an advantage in power consumption. Moreover, since the inner elements of the OLED have a solid phase, the OLED has an excellent durability against an external impact and has a wide available temperature range.

In particular, a manufacturing process of the OLED is simple. Therefore, due to the excellent characteristics of the OLED, recently, interest in an OLED lighting apparatus using the OLED as a lighting device has been increasing.

Meanwhile, the OLED lighting apparatus is a surface light source. However, since an organic emitting layer directly generating light therein radially emits the generated light, only 20% of the light generated in the organic emitting layer is emitted to the outside.

Therefore, there is a need for research to improve emitting efficiency (luminous efficiency) of an OLED lighting apparatus.

SUMMARY

Accordingly, embodiments of the invention are directed to an organic light emitting diode lighting apparatus that substantially obviates one or more of the problems due to limitations and disadvantages of the related art, and have other advantages.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

Embodiments relate to an organic light emitting diode lighting apparatus including a substrate including a plurality of emission areas and a plurality of non-emission areas surrounding edges of the plurality of emission areas; an overcoat layer disposed on the substrate and having a first non-flat top surface in at least one of the emission areas and a second non-flat top surface in at least one of the non-emission areas; an auxiliary electrode disposed on the second non-flat top surface and including a reflective material; a first electrode disposed on the first non-flat top surface in the at least one of the emission areas and disposed on the auxiliary electrode in the non-emission areas; an organic emitting layer on the first electrode; and a second electrode on the organic emitting layer, wherein the auxiliary electrode and the first electrode are in electrical contact with each other.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to embodiments of the invention, examples of which are illustrated in the accompanying drawings.

Figure 1:
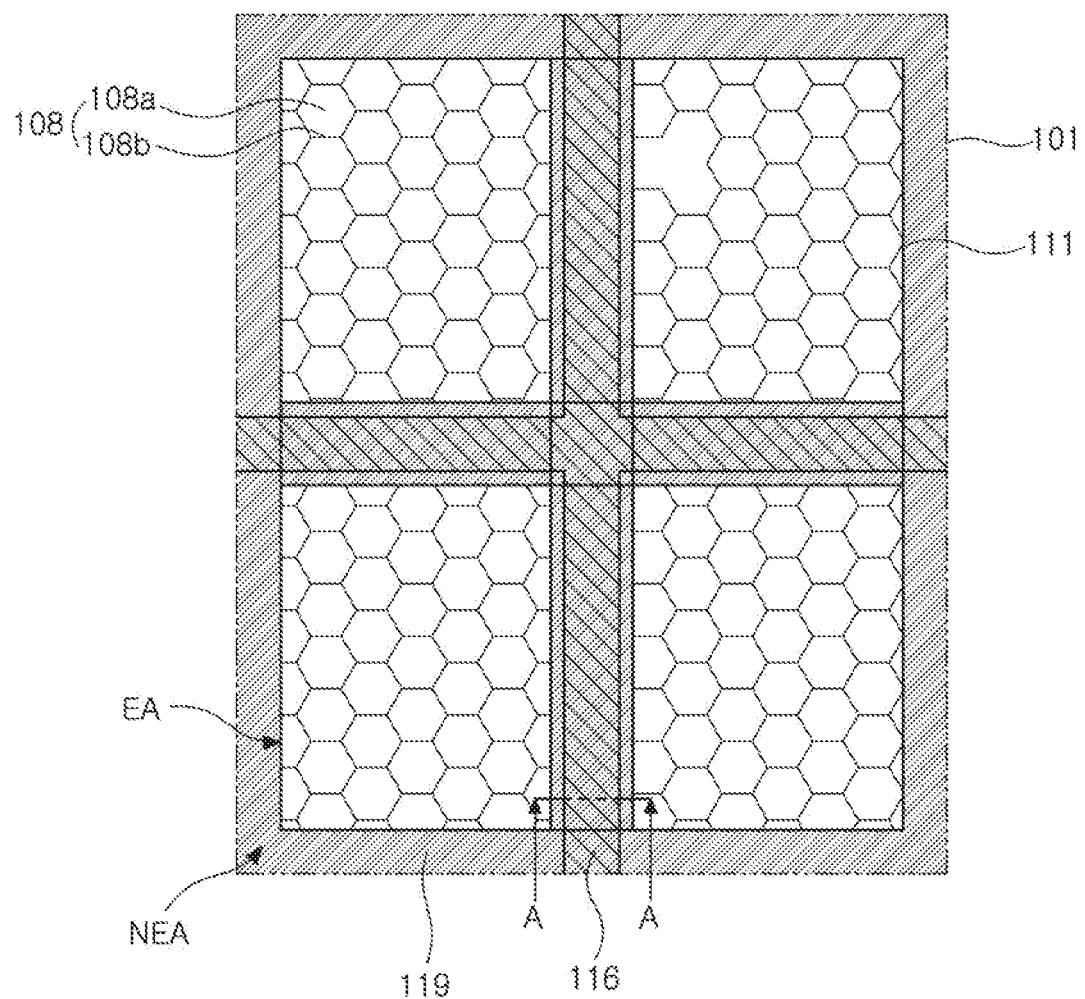
FIG. 1 is a schematic plane view illustrating a portion of an organic light emitting diode (OLED) lighting apparatus according to an embodiment of the present disclosure.

FIG. 1 is a schematic plane view illustrating a portion of an organic light emitting diode (OLED) lighting apparatus according to an embodiment of the present disclosure. All the components of the OLED lighting apparatus according to all embodiments of the present disclosure are operatively coupled and configured.

As shown in FIG. 1, in an OLED lighting apparatus 100 according to the embodiment of the present disclosure, a plurality of emission areas EA are defined on a substrate 101. A bank 119 is disposed along an edge of each of the emission areas EA to constitute a non-emission area NEA.

A first electrode 111, an organic emitting layer 113 (of FIG. 2) disposed on an upper portion of the first electrode 111 and a second electrode 15 (of FIG. 2) are sequentially formed on an entire surface of the substrate 101. The first electrode 111, the organic emitting layer 113 (of FIG. 2), and the second electrode 115 (of FIG. 2) constitute a light emitting diode E (of FIG. 2).

An auxiliary electrode 116 in electrical contact with the first electrode 111 is disposed on the non-emission areas NEA between adjacent emission areas EA. The auxiliary electrode 116 functions to prevent occurrence of a voltage drop (i.e., an IR drop) in the first electrode 111.

The auxiliary electrode 116 is formed in a mesh structure on an entire surface of the substrate 101 along the non-emission areas NEA, but the structure thereof is not limited.

On the other hand, applying a voltage is applied to the first electrode 111 from all directions by forming the auxiliary electrode 116 so as to have the mesh structure, can be more effective in preventing occurrence of a voltage drop in the first electrode 111 as compared with applying a voltage is applied to the first electrode 111 only from one direction by forming the auxiliary electrode 116 so as to have a stripe structure.

In particular, in the OLED lighting apparatus 100 according to the embodiment of the present disclosure, an overcoat layer 108 is further provided below the light emitting diode E (of FIG. 2) and the auxiliary electrode 116 on the substrate 101. The overcoat layer 108 is formed in a concavo-convex shape having a concave portion 108a of which a surface is concave toward the light emitting diode E (of FIG. 2), and a connection portion 108b which connects adjacent concave portions 108a.

As a result, it is possible to improve light extraction efficiency (out-coupling efficiency) of the OLED lighting apparatus 100 according to the embodiment of the present disclosure. In particular, since the overcoat layer 108 is even disposed below the auxiliary electrode 116, light extraction efficiency can even be improved by the auxiliary electrode 116, thereby further improving light extraction efficiency.

This will be described in more detail with reference to FIGS. 2 and 3.

Figure 2:
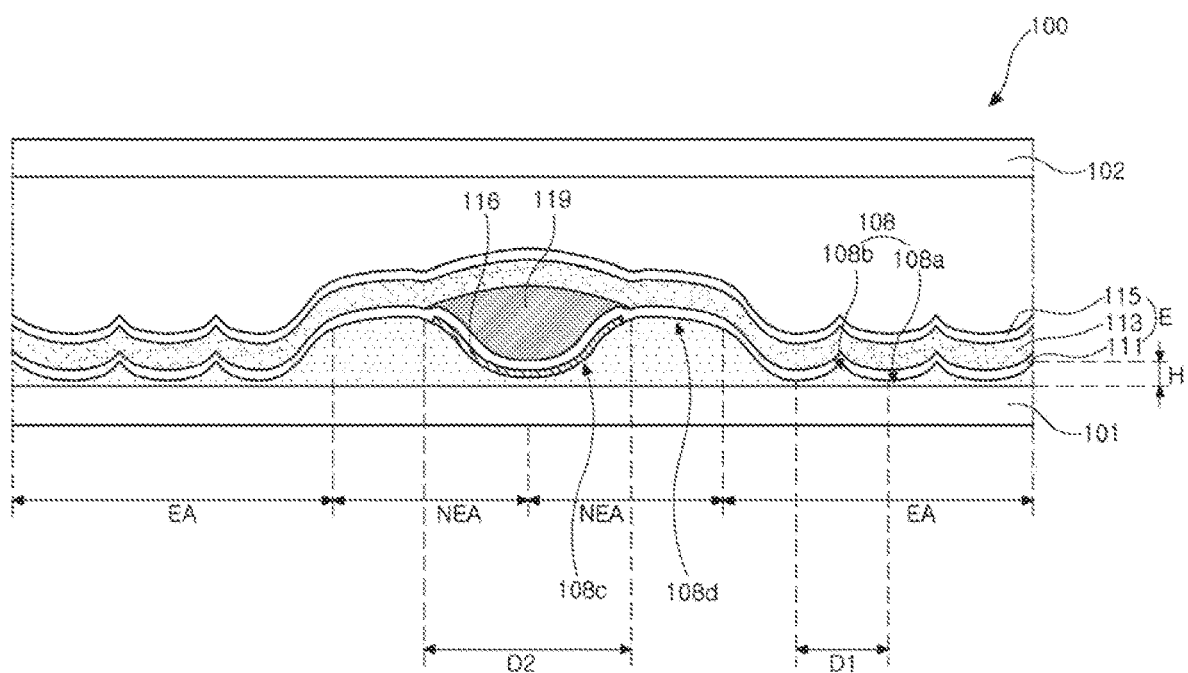
FIG. 2 is a cross-sectional view taken along line A-A of FIG. 1, and is a schematic cross-sectional view illustrating a portion of an OLED lighting apparatus according to a first embodiment of the present disclosure.

FIG. 2 is a cross-sectional view taken along line A-A of FIG. 1, and is a schematic cross-sectional view illustrating a portion of an OLED lighting apparatus according to a first embodiment of the present disclosure.

Figure 3:
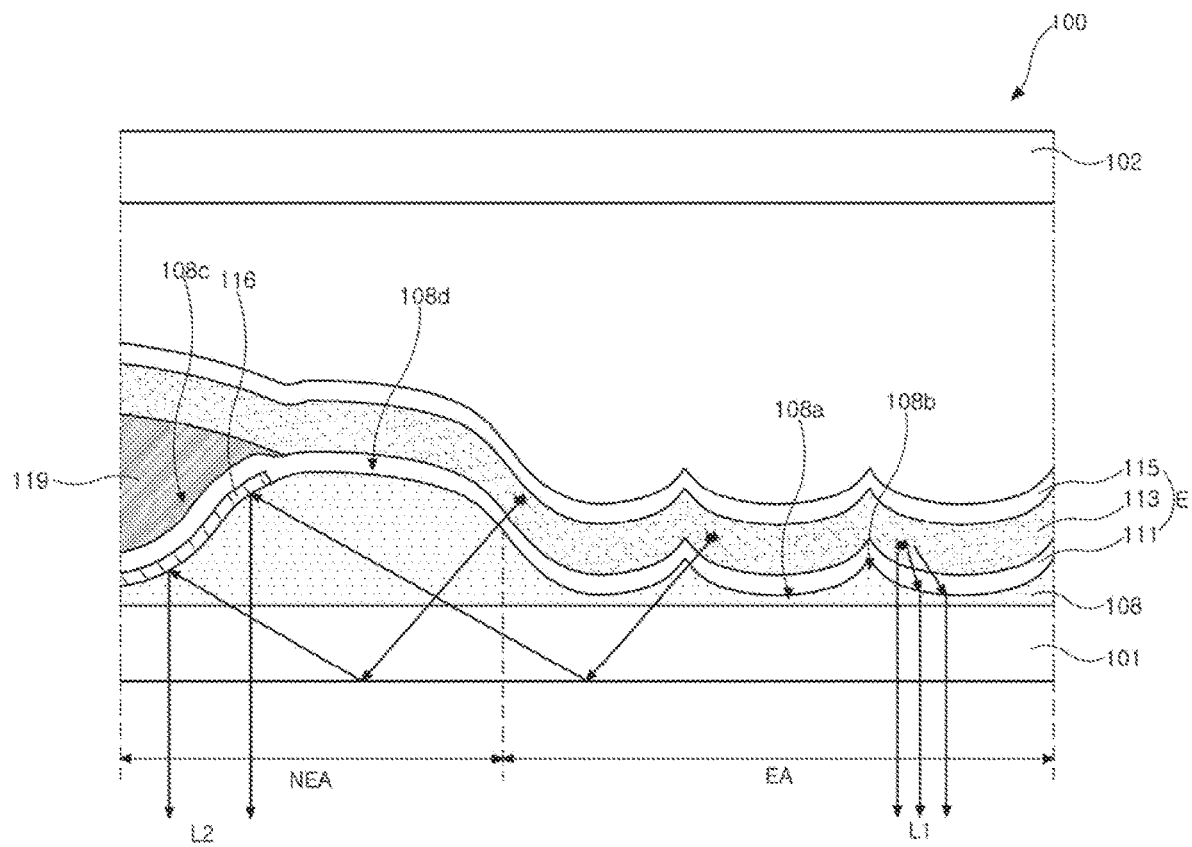
FIG. 3 is a schematic view illustrating a state in which light is guided, in a portion of the OLED lighting apparatus of FIG. 2.

FIG. 3 is a schematic view illustrating a state in which light is guided, in a portion of the OLED lighting apparatus of FIG. 2.

Referring to FIGS. 2 and 3, in the OLED lighting apparatus 100 according to the first embodiment of the present disclosure, a substrate 101, on which a light emitting diode E is formed, is encapsulated by a protective film 102.

More specifically, a plurality of emission areas EA and a plurality of non-emission areas NEA surrounding edges of the plurality of emission areas EA are defined on the substrate 101. Each of the emission areas EA is a region through which light passes. Light emitted from an organic emitting layer 113 is emitted to the outside through each of the emission areas EA.

A bank 119 is disposed along an edge of each of the emission areas EA to form the non-emission area NEA.

An overcoat layer 108 is further provided on the substrate 101 and is formed in a concavo-convex shape having a concave portion 108a, of which a surface is convex toward the substrate 101 so as to correspond to the emission area EA, and a connection portion 108b which connects adjacent concave portions 108a.

A plurality of concave portions 108a have a hemispherical or semi-elliptical shape. A diameter D1 of each of the concave portions 108a of the overcoat layer 108 means a length between centers of two adjacent concave portions 108a. Each of the plurality of concave portions 108a can have a diameter D1 of about 1 μm to about 5 μm, and the connection portion 108b can have a height H of about 1 μm to about 4 μm from a lower surface of the overcoat layer 108.

A groove portion 108c is disposed to correspond to the non-emission area NEA and is formed to be convex toward the substrate 101. A convex portion 108d is formed to be convex away from the substrate 101.

The groove portion 108c also has a hemispherical or semi-elliptical shape. The groove portion 108c disposed to correspond to the non-emission area NEA has a diameter D2 which is at least two times the diameter D1 of the concave portion 108a disposed to correspond to the emission area EA. Namely, the diameter (width) of the groove portion 108c is greater than that of the concave portion 108a. In addition, a depth of the groove portion 108c is greater than that of the concave portion 108a.

That is, when the diameter D1 of the concave portion 108a disposed to correspond to the emission area EA is about 4 μm, the diameter D2 of the groove portion 108c disposed to correspond to the non-emission area NEA can be at least two times the diameter D1 of the concave portion 108a. Thus, the diameter D2 of the groove portion 108c can be equal to or greater than about 8 μm.

In other words, the overcoat layer 108 has a first non-flat top surface in the emission area EA and a second non-flat top surface in the non-emission area NEA. The first non-flat top surface includes the concave portions 108a, and the second non-flat top surface includes the groove portion 108c.

The overcoat layer 108 can be made of an insulating material having a refractive index of about 1.5. For example, the overcoat layer 108 can be made of at least one selected from an acrylic-based resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and photoresist, but the present disclosure is not limited thereto. The overcoat layer 108 can be made of any insulating material having a refractive index of about 1.5.

Here, the OLED lighting apparatus 100 according to the first embodiment of the present disclosure is characterized in that an auxiliary electrode 116 is provided on the groove portion 108c, that is, an upper portion of the overcoat layer 108. The auxiliary electrode 116 provided on the groove portion 108c has a curved shape along the groove portion 108c of the overcoat layer 108.

The auxiliary electrode 116 can be made of a reflective material. Specifically, the auxiliary electrode 116 can be made of at least one selected from lithium (Li), calcium (Ca), lithium fluoride/calcium (LiF/Ca), lithium fluoride/aluminum (LiF/Al), aluminum (Al), silver (Ag), magnesium (Mg), and gold (Gu).

However, the first embodiment of the present disclosure is not limited thereto, and any material can be used as a material of the auxiliary electrode 116 as long as it reflects light and has relatively high electric conductivity as compared with the first electrode 111. That is, a material other than a metal can be used as the material of the auxiliary electrode 116.

Since the same voltage is applied to every position of the emission area EA through the auxiliary electrode 116, it is possible to prevent a problem wherein a voltage difference between regions near to and far from a portion to which power is input is caused by a voltage drop which generates non-uniformity of brightness or image characteristics or increases power consumption.

In particular, in the OLED lighting apparatus 100 according to the first embodiment of the present disclosure, since the auxiliary electrode 116 is provided on the groove portion 108c of the overcoat layer 108, the auxiliary electrode 116 can have a curved shape, thereby further improving light extraction efficiency due to the auxiliary electrode 116 having the curved shape.

This will be described in more detail later.

The first electrode 111 is disposed on the overcoat layer 108 and the auxiliary electrode 116 and is made, for example, of a material having a relatively high work function value to serve as an anode of the light emitting diode E.

The first electrode 111 can be made of a metal oxide such as indium tin oxide (ITO) or indium zinc oxide (IZO), a mixture of a metal and an oxide such as ZnO:Al or SnO2:Sb, or a conductive polymer such as poly(3-methylthiophene), poly[3,4-(ethylene-1,2-dioxy)thiophene] (PEDT), polypyrrole, or polyaniline. In addition, the first electrode 111 can be made of a carbon nano-tube (CNT), graphene, silver nanowire, or the like.

The first electrode 111 is disposed in each emission area EA and extends from each of the emission areas EA to the non-emission area NEA between adjacent emission areas EA to be in electrical contact with the auxiliary electrode 116.

The bank 119 is disposed in the non-emission areas NEA between adjacent emission areas EA. The bank 119 covers a portion of the first electrode 111 in the non-emission area NEA.

In this case, the bank 119 fills the groove portion 108c of the overcoat layer 108 provided in the non-emission area NEA by covering the end of the first electrode 111 extending to the non-emission area NEA.

The organic emitting layer 113 is disposed on the bank 119 and the first electrode 111. The organic emitting layer 113 can include a single layer made of a light emitting material. In order to improve emitting efficiency, the organic emitting layer 113 can include a multi-layer of a hole injection layer, a hole transport layer, an emitting material layer, an electron transport layer, and an electron injection layer.

A second electrode 115, which serves as a cathode, is disposed on an entire surface of the organic emitting layer 113.

The second electrode 115 can be made of a material having a relatively low work function value. In this case, the second electrode 115 can have a double-layered structure and can include a single layer of an alloy containing a first metal such as Ag, which has a relatively low work function, and a second metal such as Mg at a certain ratio, or multiple layers thereof.

In the light emitting diode E, when a certain voltage is applied to the first electrode 111 and the second electrode 115 according to a selected signal, holes injected from the first electrode 111 and electrons injected from the second electrode 115 are transported to the organic emitting layer 113 to form excitons. When the excitons transit from an excited state to a ground state, light is generated and emitted in the form of visible light.

In this case, the emitted light passes through the transparent first electrode 111 and is emitted to the outside.

All of the first electrode 111, the organic emitting layer 113, and the second electrode 115 sequentially disposed on the overcoat layer 108 are formed in the same structure along a surface of the overcoat layer 108. In particular, the first electrode 111, the organic emitting layer 113, and the second electrode 115 are formed in a concavo-convex shape along the concave portion 108a and the connection portion 108b provided on the surface of the overcoat layer 108 so as to correspond to the emission area EA.

Accordingly, among light emitted from the organic emitting layer 113, light trapped while being continuously totally reflected inside the organic emitting layer 113 and the second electrode 115 is extracted to the outside through multiple reflections by traveling at an angle smaller than a total reflection critical angle due to the concavo-convex shape of the overcoat layer 108.

Therefore, external emitting efficiency is increased, and light extraction efficiency of the OLED lighting apparatus 100 is improved.

The OLED lighting apparatus 100 according to the first embodiment of the present disclosure can further include the auxiliary electrode 116, thereby preventing occurrence of a voltage drop in the first electrode 111 through the auxiliary electrode 116.

More specifically, the first electrode 111 of the light emitting diode E is made of a transparent conductive material and thus has relatively high specific resistance as compared with other metals. Accordingly, as an area of the first electrode 111 is increased, a current is unlikely to uniformly flow throughout the first electrode 111.

Therefore, brightness of light emitted by the organic emitting layer 113 formed between the first electrode 111 and the second electrode 115 becomes non-uniform as the area of the first electrode 111 is increased.

Here, since the OLED lighting apparatus 100 according to the first embodiment of the present disclosure further includes the auxiliary electrode 116 in contact with the first electrode 111 through a mesh shape, the auxiliary electrode 116 compensates for relatively low electric conductivity of the first electrode 111, thereby preventing overall brightness of the light emitted from the organic emitting layer 113 of the OLED lighting apparatus 100 from being non-uniform.

For example, although the area of the first electrode 111 is increased, the auxiliary electrode 116 functions to assist the current to uniformly flow throughout the first electrode 111, thereby preventing occurrence of a voltage drop in the first electrode 111.

Accordingly, it is possible to prevent a problem wherein a voltage difference between regions near to and far from a portion to which power is input is caused by a voltage drop which generates non-uniformity of brightness or image characteristics or increases power consumption.

In particular, in the OLED lighting apparatus 100 according to the first embodiment of the present disclosure, the overcoat layer 108 has a concavo-convex shape so as to correspond to the emission area EA, and the auxiliary electrode 116 is disposed on the groove portion 108c of the overcoat layer 108, thereby improving light extraction efficiency.

More specifically, some of the light generated from the organic emitting layer 113 is reflected by the second electrode 115, and thus an optically path thereof is changed toward the first electrode 111, and the remaining light is emitted toward the first electrode 111.

A refractive index of the organic emitting layer 113 can be substantially the same as a refractive index of the first electrode 111. Therefore, an optical path of light generated in the organic emitting layer 113 is not changed at an interface between the organic emitting layer 113 and the first electrode 111.

In addition, the organic emitting layer 113 and the first electrode 111 can have a refractive index of 1.7 to 2.0.

Since the overcoat layer 108 has a refractive index of about 1.5, the light emitted from the organic emitting layer 113 is totally reflected at an interface between the first electrode 111 and the overcoat layer 108 and thus is trapped while being continuously totally reflected inside the organic emitting layer 113 and the second electrode 115.

Here, since the overcoat layer 108 of the OLED lighting apparatus 100 according to the first embodiment of the present disclosure has the plurality of concave portions 108a, an incident angle of the light emitted from the organic emitting layer 113, which is incident on the interface between the first electrode 111 and the overcoat layer 108, is likely to be smaller than a total reflection critical angle, thereby reducing an amount of light trapped inside the light emitting diode E by total reflection, light adsorption, and the like in the first electrode 111 among the light emitted from the organic emitting layer 113.

In addition, the light L1 emitted from the organic emitting layer 113 passes through the interface between the first electrode 111 and the overcoat layer 108 and travels at an angle near to an angle perpendicular to the substrate 101. Therefore, an incident angle of the light emitted from the organic emitting layer 113, which is incident on an interface of the substrate 101, is likely to be smaller than a total reflection critical angle, thereby reducing an amount of light which is totally reflected on the interface of the substrate 101 and trapped inside the OLED lighting apparatus 100.

As a result, light extraction efficiency is improved. As described, as the light extraction efficiency is increased, lifespan of the light emitting diode E is also increased.

In particular, in the OLED lighting apparatus 100 according to the first embodiment of the present disclosure, since the auxiliary electrode 116 is made of a reflective material, disposed on the groove portion 108c of the overcoat layer 108, and formed to have a curved shape, light L2 traveling to the non-emission area NEA can be extracted to the outside by the auxiliary electrode 116.

More specifically, the organic emitting layer 113 directly generating light therein radially emits the generated light, and some of the light emitted from the organic emitting layer 113 has an angle greater than a total reflection critical angle and thus is totally reflected at a boundary of the substrate 101 to travel to the non-emission area NEA without passing through the substrate 101.

The light traveling to the non-emission area NEA is also trapped inside the OLED lighting apparatus 100. In the OLED lighting apparatus 100 according to the first embodiment of the present disclosure, the light L2 trapped inside the non-emission area NEA is reflected by the auxiliary electrode 116 and thus is extracted to the outside of the substrate 101.

That is, since the auxiliary electrode 116 made of the reflective material is formed on the groove portion 108c of the overcoat layer 108 to have the curved shape, an incident surface of the auxiliary electrode 116, which reflects the light traveling to the non-emission area NEA, is formed in a curved shape to adjust an incident angle of light incident thereon so that the auxiliary electrode 116 having the curved shape prevents light having a specific angle from being totally internally reflected.

Accordingly, the light traveling to the non-emission area NEA is reflected at an angle smaller than a total reflection incident angle by the auxiliary electrode 116 and is extracted to the outside of the substrate 101. As a result, light extraction efficiency of the OLED lighting apparatus 100 according to the first embodiment of the present disclosure is also improved.

In the OLED lighting apparatus 100 according to the first embodiment of the present disclosure, light extraction efficiency is improved through the concavo-convex shape provided in the overcoat layer 108 of the emission area EA as well as the auxiliary electrode 116 having the curved shape, thereby further improving emitting efficiency of light which is extracted to the outside of the substrate 101.

In particular, the light L2 reflected by the auxiliary electrode 116 and extracted to the outside of the substrate 101 is emitted to the outside from the non-emission area NEA. As described above, the light L2 is emitted from the non-emission area NEA in which the auxiliary electrode 116 is disposed, thereby also reducing visibility of the auxiliary electrode 116 made of a metal material.

On the other hand, the groove portion 108c of the overcoat layer 108, at which the auxiliary electrode 116 is disposed, is filled and covered with the bank 119, thereby minimizing formation of a stepped portion between the organic emitting layer 113 and the second electrode 115, which are disposed on the bank 119 and the first electrode 111.

As described above, in the OLED lighting apparatus 100 according to the first embodiment of the present disclosure, since the overcoat layer 108 has the concavo-convex shape so as to correspond to the emission area EA and the auxiliary electrode 116 is particularly disposed on the groove portion 108c of the overcoat layer 108 in the non-emission area NEA, light extraction efficiency is improved through the concavo-convex shape provided in the overcoat layer 108 of the emission area EA as well as the auxiliary electrode 116 having the curved shape, thereby further improving emitting efficiency of light which is extracted to the outside of the substrate 101.

In addition, it is possible to prevent occurrence of a voltage drop in the first electrode 111 by the auxiliary electrode 116.

Figure 4:
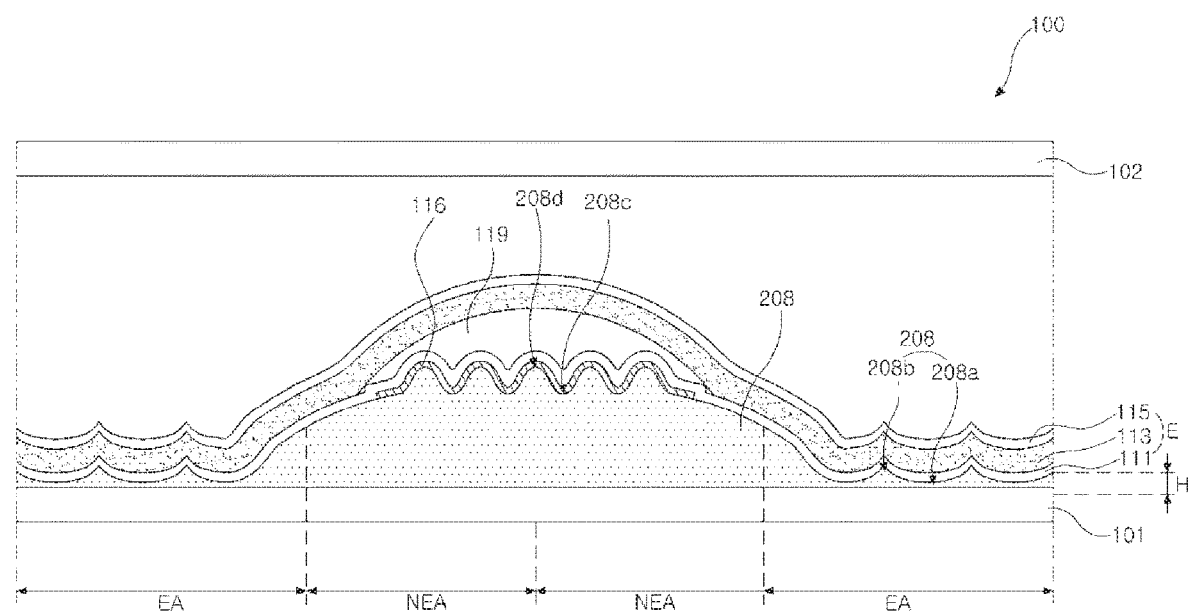
FIG. 4 is a schematic cross-sectional view illustrating a portion of an OLED lighting apparatus according to a second embodiment of the present disclosure.

FIG. 4 is a schematic cross-sectional view illustrating a portion of an OLED lighting apparatus according to a second embodiment of the present disclosure.

Meanwhile, the same reference numbers as in the first embodiment can be used to refer to the same (or similar) parts to avoid a repeated description, and the characteristic points of the second embodiment will be described only or will be focused.

As shown in FIG. 4, in an OLED lighting apparatus 100 according to the second embodiment of the present disclosure, a substrate 101, on which a light emitting diode E is formed, is encapsulated by a protective film 102.

More specifically, an overcoat layer 208 is provided on the substrate 101 and is formed in a concavo-convex (non-flat) shape having a first concave portion 208a, of which a surface is convex toward the substrate 101 so as to correspond to an emission area EA, and a connection portion 208b which connects adjacent first concave portions 208a.

A plurality of second concave portions 208c and a plurality of convex portions 208d are alternately disposed to correspond to a non-emission area NEA.

In other words, the overcoat layer 208 has a first non-flat top surface in the emission area EA and a second non-flat top surface in the non-emission area NEA. The first non-flat top surface includes the first concave portions 208a and the connection portion 208b, and the second non-flat top surface includes the plurality of second concave portions 208c and the plurality of convex portions 208d. In this instance, a width of the second concave portion 208c can be smaller than that of the first concave portion 208a.

The overcoat layer 208 can be made of an insulating material having a refractive index of about 1.5. For example, the overcoat layer 208 can be made of at least one selected from an acrylic-based resin, an epoxy resin, a phenol resin, a polyamide-based resin, a polyimide-based resin, an unsaturated polyester-based resin, a polyphenylene-based resin, a polyphenylene sulfide-based resin, benzocyclobutene, and photoresist, but the present disclosure is not limited thereto. The overcoat layer 208 can be made of any insulating material having a refractive index of about 1.5.

Here, the OLED lighting apparatus 100 according to the second embodiment of the present disclosure is characterized in that an auxiliary electrode 116 is provided on the second concave portions 208c and the convex portions 208d of the overcoat layer 208 so as to correspond to the non-emission area NEA.

The auxiliary electrode 116 disposed on the second concave portions 208c and the convex portions 208d of the overcoat layer 208 has lens shapes along the second concave portions 208c and the convex portions 208d provided on a surface of the overcoat layer 208.

The auxiliary electrode 116 can be made of a reflective material. Specifically, the auxiliary electrode 116 can be made of at least one selected from lithium (Li), calcium (Ca), lithium fluoride/calcium (LiF/Ca), lithium fluoride/aluminum (LiF/Al), aluminum (Al), silver (Ag), magnesium (Mg), and gold (Gu).

Since the same voltage is applied to every position of the emission area EA through the auxiliary electrode 116, it is possible to prevent a problem wherein a voltage difference between regions near to and far from a portion to which power is input is caused by a voltage drop which generates non-uniformity of brightness or image characteristics or increases power consumption.

In particular, in the OLED lighting apparatus 100 according to the second embodiment of the present disclosure, since the auxiliary electrode 116 is disposed on the second concave portions 208c and the convex portions 208d of the overcoat layer 208, the auxiliary electrode 116 can have the lens shape, thereby further improving light extraction efficiency due to the auxiliary electrode 116 having the lens shape.

A first electrode 111 is disposed on the auxiliary electrode 116 and the overcoat layer 108 and is made, for example, of a material having a relatively high work function value to constitute an anode of the light emitting diode E.

The first electrode 111 can be made of a metal oxide such as indium tin oxide (ITO) or indium zinc oxide (IZO), a mixture of a metal and an oxide such as ZnO:Al or $SnO_2$:Sb, or a conductive polymer such as poly(3-methylthiophene), poly[3,4-(ethylene-1,2-dioxy)thiophene] (PEDT), polypyrrole, or polyaniline. In addition, the first electrode 111 can be made of a carbon nano-tube (CNT), graphene, silver nano-wire, or the like.

The first electrode 111 is disposed in each emission area EA and extends from each of the emission areas EA to the non-emission area NEA between adjacent emission areas EA to be in electrical contact with the auxiliary electrode 116.

A bank 119 is disposed in the non-emission areas NEA between adjacent emission areas EA. The bank 119 covers a portion of the first electrode 111 in the non-emission area NEA.

An organic emitting layer 113 is disposed on the bank 119 and the first electrode 111. The organic emitting layer 113 can include a single layer made of a light emitting material. In order to improve emitting efficiency, the organic emitting layer 113 can include a multi-layer of a hole injection layer, a hole transport layer, an emitting material layer, an electron transport layer, and an electron injection layer.

A second electrode 115, which constitutes a cathode, is disposed on an entire surface of the organic emitting layer 113.

The second electrode 115 can be made of a material having a relatively low work function value. In this case, the second electrode 115 can have a double-layered structure and can include a single layer of an alloy containing a first metal such as Ag, which has a relatively low work function, and a second metal such as Mg at a certain ratio, or multiple layers thereof In the light emitting diode E, when a certain voltage is applied to the first electrode 111 and the second electrode 115 according to a selected signal, holes injected from the first electrode 111 and electrons injected from the second electrode 115 are transported to the organic emitting layer 113 to form excitons. When the excitons transit from an excited state to a ground state, light is generated and emitted in the form of visible light.

In this case, the emitted light passes through the transparent first electrode 111 and is emitted to the outside.

All of the first electrode 111, the organic emitting layer 113, and the second electrode 115 sequentially disposed on the overcoat layer 208 are formed in the same structure along the surface of the overcoat layer 208. In particular, the first electrode 111, the organic emitting layer 113, and the second electrode 115 are formed in a concavo-convex shape along the concave portion 208a and the connection portion 208b provided on the surface of the overcoat layer 208 so as to correspond to the emission area EA.

Accordingly, among light emitted from the organic emitting layer 113, light trapped while being continuously totally reflected inside the organic emitting layer 113 and the second electrode 115 is extracted to the outside through multiple reflections by traveling at an angle smaller than a total reflection critical angle due to the concavo-convex shape of the overcoat layer 208.

Therefore, external emitting efficiency is increased, and light extraction efficiency of the OLED lighting apparatus 100 according to the second embodiment of the present invention is improved.

In addition, in the OLED lighting apparatus 100 according to the second embodiment of the present disclosure, since the auxiliary electrode 116 is disposed on the second concave portions 208c and the convex portions 208d of the overcoat layer 208, the auxiliary electrode 116 can have the lens shape, thereby further improving light extraction efficiency due to the auxiliary electrode 116 having the lens shape.

More specifically, the organic emitting layer 113 directly generating light therein radially emits the generated light, and some of the light emitted from the organic emitting layer 113 has an angle greater than a total reflection critical angle and thus is totally reflected on a boundary of the substrate 101 to travel to the non-emission area NEA without passing through the substrate 101.

The light traveling to the non-emission area NEA is also trapped inside the OLED lighting apparatus 100. In the OLED lighting apparatus 100 according to the second embodiment of the present disclosure, the light trapped inside the non-emission area NEA is reflected by the auxiliary electrode 116 and thus is extracted to the outside of the substrate 101.

That is, since the auxiliary electrode 116 made of the reflective material has the lens shapes along the surface of the overcoat layer 208, an incident surface of the auxiliary electrode 116, which reflects the light traveling to the non-emission area NEA, is formed in a curved shape to adjust an incident angle of light incident thereon so that the auxiliary electrode 116 having the curved shape prevents light having a specific angle from being totally internally reflected.

Accordingly, the light traveling to the non-emission area NEA is reflected at an angle smaller than a total reflection incident angle by the auxiliary electrode 116 and is extracted to the outside of the substrate 101. As a result, light extraction efficiency of the OLED lighting apparatus 100 according to the second embodiment of the present disclosure is also improved.

For example, in the OLED lighting apparatus 100 according to the second embodiment of the present disclosure, light extraction efficiency is improved through the concavo-convex shape provided in the overcoat layer 208 of the emission area EA as well as the auxiliary electrode 116 having the lens shapes, thereby further improving emitting efficiency of light which is extracted to the outside of the substrate 101.

In particular, light reflected by the auxiliary electrode 116 and extracted to the outside of the substrate 101 is emitted to the outside from the non-emission area NEA. As described above, the light is emitted from the non-emission area NEA in which the auxiliary electrode 116 is disposed, thereby reducing visibility of the auxiliary electrode 116 made of a metal material.

As described above, according to various embodiments of the present disclosure, since a concavo-convex shape is provided in an overcoat layer so as to correspond to an emission area and an auxiliary electrode is particularly disposed on a groove portion of the overcoat layer in a non-emission area, light extraction efficiency is improved through the concavo-convex shape provided in the overcoat layer of the emission area as well as the auxiliary electrode having the curved shape, thereby further improving emitting efficiency of light which is extracted to the outside of a substrate.

In addition, occurrence of a voltage drop in a first electrode is prevented by the auxiliary electrode, which is advantageous.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. An organic light emitting diode lighting apparatus, comprising:
   a substrate including a plurality of emission areas and a plurality of non-emission areas surrounding edges of the plurality of emission areas;
   an overcoat layer disposed on the substrate, and having a first non-flat top surface in at least one of the emission areas and a second non-flat top surface in at least one of the non-emission areas;
   an auxiliary electrode disposed on the second non-flat top surface and including a reflective material;
   a first electrode disposed on the first non-flat top surface in the at least one of the emission areas and disposed on the auxiliary electrode in the non-emission areas;
   an organic emitting layer on the first electrode; and
   a second electrode on the organic emitting layer,
   wherein the auxiliary electrode and the first electrode are in electrical contact with each other,
   wherein light emitted from the organic light emitting layer passes through an interface between the first electrode and the overcoat layer, and the substrate, and
   wherein the auxiliary electrode is disposed in at least one of the non-emission areas and not disposed in the emission areas.

2. The organic light emitting diode lighting apparatus of claim 1, wherein the first non-flat top surface includes a plurality of first concave portions.

3. The organic light emitting diode lighting apparatus of claim 2, wherein the first non-flat top surface further includes a plurality of connection portions connecting the plurality of first concave portions.

4. The organic light emitting diode lighting apparatus of claim 2, wherein the second non-flat top surface includes a groove portion.

5. The organic light emitting diode lighting apparatus of claim 4, wherein the groove portion has a hemispherical shape or a semi-elliptical shape.

6. The organic light emitting diode lighting apparatus of claim 4, further comprising:
   a bank disposed in at least one of the non-emission areas, wherein the groove portion is filled with the bank.

7. The organic light emitting diode lighting apparatus of claim 4, wherein a width of the groove portion is greater than a width of each of the plurality of first concave portions.

8. The organic light emitting diode lighting apparatus of claim 4, wherein a depth of the groove portion is greater than a depth of each of the plurality of first concave portions.

9. The organic light emitting diode lighting apparatus of claim 2, wherein the second non-flat top surface includes a plurality of second concave portions.

10. The organic light emitting diode lighting apparatus of claim 9, further comprising:
    a groove portion in the second non-flat top surface; and
    a bank disposed in at least one of the non-emission areas, wherein the groove portion is filled with the bank.

11. The organic light emitting diode lighting apparatus of claim 1, wherein the auxiliary electrode has a mesh shape.

12. The organic light emitting diode lighting apparatus of claim 1, wherein the auxiliary electrode is interposed between the overcoat layer and the first electrode.

13. The organic light emitting diode lighting apparatus of claim 1, wherein the auxiliary electrode is in direct physical contact with the overcoat layer.

14. The organic light emitting diode lighting apparatus of claim 1, wherein the first electrode is made of a transparent conductive material, and
    wherein the auxiliary electrode has a curved shape.

15. The organic light emitting diode lighting apparatus of claim 14, wherein the auxiliary electrode is disposed along a curved shape of the second non-flat top surface.

16. The organic light emitting diode lighting apparatus of claim 2, wherein the second non-flat top surface includes a convex portion, and
    wherein a diameter of the convex portion is at least two times a diameter of the plurality of first concave portions.

17. The organic light emitting diode lighting apparatus of claim 16, wherein the diameter of the convex portion is equal to or greater than about 8 μm.

18. An organic light emitting diode lighting apparatus, comprising:
    a substrate including a plurality of emission areas and a plurality of non-emission areas surrounding edges of the plurality of emission areas;
    an overcoat layer disposed on the substrate, and having a first non-flat top surface in at least one of the emission areas and a second non-flat top surface in at least one of the non-emission areas;
    an auxiliary electrode disposed on the second non-flat top surface and including a reflective material;
    a first electrode disposed on the first non-flat top surface in the at least one of the emission areas and disposed on the auxiliary electrode in the non-emission areas;
    an organic emitting layer on the first electrode; and a second electrode on the organic emitting layer,
wherein the auxiliary electrode and the first electrode are in electrical contact with each other,
wherein the first non-flat top surface includes a plurality of first concave portions,
wherein the second non-flat top surface includes a plurality of second concave portions, and
wherein a width of each of the plurality of second concave portions is smaller than a width of each of the plurality of first concave portions.

* * * * *